(12) United States Patent
Chung et al.

(10) Patent No.: US 9,337,027 B2
(45) Date of Patent: May 10, 2016

(54) METHOD OF MANUFACTURING SUBSTRATES HAVING IMPROVED CARRIER LIFETIMES

(71) Applicant: Dow Corning Corporation, Midland, MI (US)

(72) Inventors: Gilyong Chung, Midland, MI (US); Mark Loboda, Bay City, MI (US)

(73) Assignee: Dow Corning Corporation, Midland, MI (US)

( * ) Notice: Subject to any disclaimer, the term of this patent is extended or adjusted under 35 U.S.C. 154(b) by 213 days.

(21) Appl. No.: 13/745,066

(22) Filed: Jan. 18, 2013

(65) Prior Publication Data

US 2014/0203297 A1    Jul. 24, 2014

Related U.S. Application Data

(63) Continuation-in-part of application No. 12/373,145, filed as application No. PCT/US2007/016192 on Jul. 17, 2007, now abandoned.

(60) Provisional application No. 60/831,839, filed on Jul. 19, 2006.

(51) Int. Cl.
*H01L 21/02* (2006.01)
*C23C 16/32* (2006.01)

(52) U.S. Cl.
CPC ........ *H01L 21/02529* (2013.01); *C23C 16/325* (2013.01); *H01L 21/0262* (2013.01); *H01L 21/02378* (2013.01); *H01L 21/02433* (2013.01); *H01L 21/02576* (2013.01); *H01L 21/02579* (2013.01)

(58) Field of Classification Search
None
See application file for complete search history.

(56) References Cited

U.S. PATENT DOCUMENTS

| 4,623,425 | A | * | 11/1986 | Suzuki et al. | 117/95 |
| 5,319,220 | A | * | 6/1994 | Suzuki et al. | 257/77 |
| 7,785,414 | B2 | | 8/2010 | Maruyama et al. | |
| 2002/0056411 | A1 | * | 5/2002 | Hara et al. | 117/13 |
| 2006/0220026 | A1 | * | 10/2006 | Uchida et al. | 257/77 |
| 2008/0032880 | A1 | * | 2/2008 | Maruyama et al. | 501/88 |

FOREIGN PATENT DOCUMENTS

JP    WO2005-5116307    * 12/2005

OTHER PUBLICATIONS

Kordina, App Phys Lett, V69, p. 679, Jul. 1996.*
JP 09-064157, "Susceptor for Semiconductor Substrate", 1997, Fuji Electric Co. Ltd.—Abstract only.
JP 09-052796, "Method for Growing Silicon Carbide Crystal and Silicon Carbide Semiconductor Device", 1997, Fuji Electric Co. Ltd.—Abstract only.

* cited by examiner

*Primary Examiner* — Joseph Miller, Jr.
(74) *Attorney, Agent, or Firm* — Timothy J. Troy

(57) ABSTRACT

This invention relates to a method for depositing silicon carbide material onto a substrate such that the resulting substrate has a carrier lifetime of 0.5-1000 microseconds, the method comprising a. introducing a gas mixture comprising a chlorosilane gas, a carbon-containing gas, and hydrogen gas into a reaction chamber containing a substrate; and b. heating the substrate to a temperature of greater than 1000° C. but less than 2000° C.; with the proviso that the pressure within the reaction chamber is maintained in the range of 0.1 to 760 torr. This invention also relates to a method for depositing silicon carbide material onto a substrate such that the resulting substrate has a carrier lifetime of 0.5-1000 microseconds, the method comprising a. introducing a gas mixture comprising a non-chlorinated silicon-containing gas, hydrogen chloride, a carbon-containing gas, and hydrogen gas into a reaction chamber containing a substrate; and b. heating the substrate to a temperature of greater than 1000° C. but less than 2000° C.; with the proviso that the pressure within the reaction chamber is maintained in the range of 0.1 to 760 torr.

9 Claims, No Drawings

METHOD OF MANUFACTURING SUBSTRATES HAVING IMPROVED CARRIER LIFETIMES

CROSS-REFERENCE TO RELATED APPLICATIONS

This application is a continuation-in-part of U.S. patent application Ser. No. 12/373,145 filed Jan. 9, 2009 which is a U.S. national stage filing under 35 U.S.C. §371 of PCT Application No. PCT/US07/016192 filed on Jul. 17, 2007, which claims the benefit of U.S. Provisional Patent Application No. 60/831,839 filed Jul. 19, 2006 under 35 U.S.C. §119 (e). U.S. patent application Ser. No. 12/373,145, PCT Application No. PCT/US07/016192, and U.S. Provisional Patent Application No. 60/831,839 are hereby incorporated by reference.

This invention was made with United States Government support under Contract No. N00014-05-C-0324 awarded by the Office of Naval Research. The United States Government may have certain rights in the invention.

BACKGROUND OF THE INVENTION

The present invention relates to the growth of silicon carbide epitaxial layers. As a semiconductor material, silicon carbide is particularly superior for high power, high frequency, and high temperature electronic devices. Silicon carbide has an extremely high thermal conductivity, and can withstand both high electric fields and high current densities before breakdown. Silicon carbide's wide band gap results in low leakage currents even at high temperatures. For these and other reasons, silicon carbide is a quite desirable semiconductor material for power devices; i.e., those designed to operate at relatively high voltages.

Silicon carbide is, however, a difficult material to work with. Growth processes must be carried out at relatively high temperatures, above at least about 1400° C. for epitaxial growth and approximately 2000° C. for sublimation growth. Additionally, silicon carbide can form over 150 polytypes, many of which are separated by small thermodynamic differences. As a result, single crystal growth of silicon carbide, either by epitaxial layer or bulk crystal, is a challenging process. Finally, silicon carbide's extreme hardness (it is most often industrially used as an abrasive material) contributes to the difficulty in handling it and forming it into appropriate semiconductor devices.

Nevertheless, over the last decade much progress has been made in growth techniques for silicon carbide and are reflected, for example, in U.S. Pat. Nos. 4,912,063; 4,912,064; Re. Pat. No. 34,861; U.S. Pat. Nos. 4,981,551; 5,200,022; 5,459,107; and 6,063,186.

One particular growth technique is referred to as "chemical vapor deposition" or "CVD." In this technique, source gases (such as silane $SiH_4$ and propane $C_3H_8$ for silicon carbide) are introduced into a heated reaction chamber that also includes a substrate surface upon which the source gases react to form the epitaxial layer. In order to help control the rate of the growth reaction, the source gases are typically introduced with a carrier gas, with the carrier gas forming the largest volume of the gas flow.

Chemical vapor deposition (CVD) growth processes for silicon carbide have been refined in terms of temperature profiles, gas velocities, gas concentrations, chemistry, and pressure. The selection of conditions used to produce particular epilayers is often a compromise among factors such as desired growth rate, reaction temperature, cycle time, gas volume, equipment cost, doping uniformity, and layer thicknesses.

Silicon carbide is a wide band gap semiconductor material with theoretical properties that offer promise to build high performance diodes and transistors. Compared to materials like silicon, these semiconductor devices would be capable of operating at higher power and switching speeds.

Power electronics applications often prefer to build circuits with a transistor or diode design, one class of these devices are known as minority carrier or bipolar devices. The operating characteristics of these types of devices depend on the generation rate and recombination rate of electron hole pairs. The inverse of the rate is called the lifetime. Specific bipolar devices include PiN diodes, insulated gate bipolar transistors (IGBT), thyristors, and bipolar junction transistors.

A key material parameter which must be optimized to theoretical levels for semiconductor power device performance is the carrier recombination lifetime. In silicon, lifetimes are limited by impurities like iron. In silicon carbide, less is known than silicon, but the best knowledge to date indicates that the lifetime of silicon carbide is degraded by the presence of vacancies and antisites in the crystal lattice. Vacancies are locations where a silicon or carbon atom is absent. An antisite is a location where the wrong atom is located.

Semiconductor silicon carbide is typically grown by physical vapor transport methods (also known as sublimation) from solid mixtures which could contain silicon, carbon, silicon carbide, or by chemical vapor deposition (CVD) from gas mixtures of silanes and hydrocarbons. Silicon carbide materials grown by these methods have lifetime's less than 500 ns, too small to realize theoretical device behavior in silicon carbide diodes and transistors. Epitaxial layers of semiconductor silicon carbide often exhibit lifetime values much less than 2 microseconds which is low compared to materials like silicon and low compared to the expected theoretical values for silicon carbide.

BRIEF SUMMARY OF THE INVENTION

In a first embodiment this invention relates to a method for depositing silicon carbide coating onto a substrate such that the resulting coating has a carrier lifetime of 0.5-1000 microseconds, the method comprising a. introducing a gas mixture comprising a chlorosilane gas, a carbon-containing gas, and hydrogen gas into a reaction chamber containing a substrate; and b. heating the substrate to a temperature of greater than 1000° C. but less than 2000° C.; with the proviso that the pressure within the reaction chamber is maintained in the range of 0.1 to 760 torr.

In a second embodiment, this invention relates to a method for depositing silicon carbide coating onto a substrate such that the resulting coating has a carrier lifetime of 0.5-1000 microseconds, the method comprising a. introducing a gas mixture comprising a non-chlorinated silicon-containing gas, hydrogen chloride, a carbon-containing gas, and hydrogen gas into a reaction chamber containing a substrate; and b. heating the substrate to a temperature of greater than 1000° C. but less than 2000° C.; with the proviso that the pressure within the reaction chamber is maintained in the range of 0.1 to 760 torr.

DETAILED DESCRIPTION OF THE INVENTION

In the first embodiment of this invention the gas mixture can further comprise a doping gas. The doping gas is exemplified by nitrogen gas, phosphine gas, or trimethylaluminum gas. The chlorosilane gas typically has the formula $R_wH_xSi_y$-$Cl_z$, where y and z are greater than zero, w and x are greater than or equal to zero, and R denotes a hydrocarbon group. The hydrocarbon group is exemplified by hydrocarbon groups containing from 1-3 carbon atoms illustrated by alkyl radicals such as the methyl, ethyl, or propyl, alkenyl radicals such as the vinyl or allyl, halohydrocarbon radicals such as 3-chloropropyl. The R group can be identical or different as desired. R is illustrated by monovalent hydrocarbon radicals having from 1 to 3 carbon atoms such as methyl, ethyl, or propyl. The value of w is typically from 0 to 3, the value of x is typically from 0 to 3, and the value of y is typically from 1 to 3, and the value of z is typically from 1 to 3. The chlorosilane gas is illustrated by dichlorosilane gas, trichlorosilane gas, trimethylchlorosilane gas, methylhydrogendichlorosilane gas, dimethylhydrogenchlorosilane gas, dimethyldichlorosilane gas, methyltrichlorosilane gas, or mixtures thereof.

The carbon-containing gas in the first embodiment of this invention typically has the formula $H_aC_bCl_c$, where a and b are greater than zero, and c is greater than or equal to zero. The carbon-containing gas is exemplified by $C_3H_8$ gas, $C_2H_6$ gas, $CH_3Cl$ gas, or $CH_3CH_2CH_2Cl$ gas.

In the first embodiment of this invention, the substrate is typically heated to a temperature of from 1200° C. to 1800° C. The substrate can be heated using any conventional means available or the reaction chamber itself can be heated to a temperature sufficient to raise the temperature of the substrate to the desired level. The substrate comprises a single crystal silicon carbide substrate or a single crystal silicon wafer. The crystal structure of the substrate is hexagonal. Such substrates are commercially available and the most common are referred to as 4H-SiC or 6H-SiC. In this notation the H refers to "hexagonal" and the number refers to the number of repeat units of silicon and carbon bi-layer stacking arrangements. The substrate may be fabricated such that normal to its surface is tilted at an angle relative to the [0001] plane of the SiC of the crystal. The angle of tilt is typically from 0 to 8 degrees.

The total pressure of the gases in the reaction chamber in the first embodiment can be varied over a wide range from 0.1 to 760 torr and is generally controlled to a level which provides a reasonable rate of epitaxial growth. The pressure within the reaction chamber is typically from 10 to 250 torr, alternatively, pressures in the range of about 80 to 200 torr can be used.

The amount of chemical vapor introduced into the reaction chamber in the first embodiment of this invention should be that which allows for a desirable silicon carbide epitaxial layer growth rate, growth uniformity and, doping gas incorporation. Total gas flow rates are typically in the 1-150 liters per minute range, depending on the size of the reaction chamber and the temperature profile. The combined flow rates of the carbon and silicon containing gases are typically in the range of 0.1 to 30% of the total flow rate. Flow rates of doping gases are typically much less than 1% of the total flow rate. The ratio of the flow rates of the carbon containing gas to the silicon containing gas will typically range 0.3 to 3 and are adjusted based on the desired doping gas incorporation efficiency and surface morphology, the ratio is strongly influenced by the reaction chamber design (size, temperature profile, etc.). Under these conditions, growth rates in the range of about 1-100 micrometers/hr may generally be achieved. Those of skill in the art should appreciate that specific parameters such as gas flow, pressure and wafer temperature can vary greatly from embodiment to embodiment still obtain a like or similar result without departing from the spirit and scope of the invention.

The first embodiment of the invention can be conducted under static conditions, but it is usually preferred to continuously introduce a controlled amount of the gas mixture into one portion of a chamber while drawing a vacuum from another site in the chamber so as to cause flow of the vapor to be uniform over the area of the substrate.

The reaction chamber used in the process of the invention can be any chamber which facilitates the growth of films by a chemical vapor deposition process. Examples of such chambers are described by Nordell et al., Journal Electrochemical Soc., Vol. 143, No. 9, 1996 (page 2910) or Steckl and Li, IEEE Transactions on Electronic Devices, Vol. 39, No. 1, January 1992.

The resultant product of the first embodiment is a crystalline 4H, silicon carbide substrate coated with a film of single crystal silicon carbide. The coating can be grown in a wide variety of thicknesses such as from about 1 nm up to 25 cm. The coating can be separated from the substrate and be used as a new substrate if desired.

In the second embodiment of this invention the gas mixture can further comprise a doping gas. The doping gas is as described above for the first embodiment of this invention. The non-chlorinated silicon-containing gas in the second embodiment of this invention has the formula $R_wH_xSi_y$, where y is greater than zero, w and x are greater than or equal to zero, and R denotes a hydrocarbon group. The hydrocarbon group is as described above. The non-chlorinated silicon-containing gas is illustrated by trimethylhydrogensilane gas, dimethyldihydrogensilane gas, methyltrihydrogensilane gas, or mixtures thereof. The carbon-containing gas in the second embodiment has the formula $H_aC_bCl_c$, where a and b are greater than zero, and c is greater than or equal to zero. The carbon-containing gas is illustrated by $C_3H_8$ gas, $C_2H_6$ gas, $CH_3Cl$ gas, or $CH_3CH_2CH_2Cl$ gas. It is typical that at least one gas in the gas mixture will contain a chlorine atom.

In the second embodiment of this invention, the substrate is typically heated to a temperature of from 1200° C. to 1800° C. The substrate in the second embodiment of this invention is as described above for the first embodiment.

The total pressure of the gases in the reaction chamber in the second embodiment can be varied over a wide range from 0.1 to 760 torr and is generally controlled to a level which provides a reasonable rate of epitaxial growth. The pressure within the reaction chamber is typically from 10 to 250 torr, alternatively, pressures in the range of about 80 to 200 torr can be used.

The amount of chemical vapor introduced into the reaction chamber in the second embodiment of this invention should be that which allows for a desirable silicon carbide epitaxial layer growth rate, growth uniformity and, doping gas incorporation. Total gas flow rates are typically in the 1-150 liters per minute range, depending on the size of the reaction chamber and the temperature profile. The combined flow rates of the carbon-containing and non-chlorinated silicon-containing gases are typically in the range of 0.1 to 30% of the total flow rate. Flow rates of doping gases are typically much less than 1% of the total flow rate. The ratio of the flow rates of the carbon-containing gas to the non-chlorinated silicon-containing gas will typically range 0.3 to 3 and are adjusted based on the desired doping gas incorporation efficiency and surface morphology, the ratio is strongly influenced by the reaction chamber design (size, temperature profile, etc.). Under these conditions, growth rates in the range of about 1-100 micrometers/hr may generally be achieved. Those of skill in the art should appreciate that specific parameters such as gas flow, pressure and wafer temperature can vary greatly from embodiment to embodiment still obtain a like or similar result without departing from the spirit and scope of the invention.

The second embodiment of the invention can be conducted under static conditions, but it is usually preferred to continuously introduce a controlled amount of the gas mixture into one portion of a chamber while drawing a vacuum from another site in the chamber so as to cause flow of the vapor to be uniform over the area of the substrate.

The reaction chamber used in the second embodiment of the invention is as described above for the first embodiment.

The resultant product of the second embodiment is a crystalline 4H silicon carbide substrate coated with a film of single crystal silicon carbide The coating can be grown in a wide variety of thicknesses such as from about 1 nm up to 25 cm. The coating can be separated from the substrate and be used as a new substrate if desired.

The products of the methods in the above embodiments of this invention are useful in semiconductor devices. The product can serve as a single substrate containing a coating or the coating can be separated from the substrate and converted to several substrates. The product can be processed into transistors or diodes or integrated semiconductor devices. Thus this invention also relates to a semiconductor device comprising (i) at least one semiconductor device component and (ii) a substrate comprising a silicon carbide region having a carrier lifetime of 0.5-1000 microseconds. The semiconductor device component is illustrated by transistors and diodes such as PiN diodes, insulated gate bipolar transistors (IGBT), thyristors, and bipolar junction transistors. The substrate is as described above in the two embodiments of this invention.

EXAMPLES

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

Measurements of the carrier lifetime were performed using microwave photoconductive decay. The lifetime value extracted from this technique is a combination of surface recombination rates and bulk recombination rates or lifetimes.

Example 1

Five silicon carbide wafers (4H n+ SiC, 76 mm diameter, 8 degrees tilted to <1120>) were placed into a reaction chamber and heated to approximately 1570-1600° C. The pressure in the reaction chamber was maintained at 95 torr. A gas mixture containing hydrogen gas, propane gas, dichlorosilane gas and nitrogen gas was introduced into the reaction chamber while the above pressure was maintained. The resulting products were 5 silicon carbide wafers, each wafer containing a 30 um 4H SiC epitaxial layer. The n-type doping achieved with the nitrogen flow corresponds to a net carrier concentration of about $6 \times 10^{14}/cm^3$. Recombination lifetime measurements were performed using the microwave photoconductive decay technique. The individual median lifetimes measured on the five wafers ranged 1.0-6.0 microseconds. The individual mean lifetimes measured on the five wafers ranged 1.2-12.0 microseconds.

Example 2

One of the silicon carbide wafers (4H n+ SiC, 76 mm diameter, 8 degrees tilted to <1120>) from Example 1 was individually tested using time resolved photoluminescence spectroscopy and the lifetime was determined from the decay of the photoluminescence signal. The lifetime was evaluated by scanning the material along both the x axis and y axis diameters. When measured by microwave photoconductive decay the sample had a lifetime value range of 5-12 microseconds, when measured by time resolved photoluminescence spectroscopy the lifetime value range was 2-4 microseconds.

Example 3

Five silicon carbide wafers (4H n+ SiC, 76 mm diameter, 8 degrees tilted to <1120>) were placed in a reaction chamber and heated to approximately 1570-1600° C. The pressure in the reaction chamber was maintained at 95 torr. A gas mixture containing hydrogen gas, propane gas, trichlorosilane gas and nitrogen gas was introduced into the reaction chamber while the above pressure was maintained. The resulting products were 5 silicon carbide wafers, each wafer containing a 30 um 4H SiC epitaxial layer. The n-type doping achieved with the nitrogen flow corresponds to a net carrier concentration of about $5 \times 10^{15}/cm^3$. Recombination lifetime measurements were performed using the microwave photoconductive decay technique. The individual median lifetimes measured on the five wafers ranged 0.9-1.2 microseconds. The individual mean lifetimes measured on the five wafers ranged 0.9-1.6 microseconds.

Thus the methods of this invention minimize lifetime limiting defects in single crystal silicon carbide materials. This invention describes methods to grow silicon carbide with recombination lifetime values more closely approaching theoretical silicon carbide values than other methods currently known in the art of growing silicon carbide.

That which is claimed is:

1. A method for depositing silicon carbide coating onto a single crystal silicon carbide substrate such that the resulting coating has a carrier lifetime of 0.5-1000 microseconds, the method comprising
   a. continuously introducing a controlled amount of a gas mixture comprising a chlorosilane gas, wherein the chlorosilane gas is dichlorosilane gas, methylhydrogendichlorosilane gas, dimethyldichlorosilane gas, or mixtures thereof, a carbon-containing gas, and hydrogen gas into one portion of a reaction chamber containing a 4H single crystal silicon carbide substrate having an angle of tilt of 4 to 8 degrees while drawing a vacuum from another site in the reaction chamber so as to cause flow of the vapor to be uniform over the area of the substrate;
   b. heating the substrate to a temperature of greater than 1200° C. but less than 1800° C.; with the proviso that the pressure within the reaction chamber is maintained in the range of 10 to 250 torr, wherein a total gas flow rate is 1-150 liters per minute, and a combined flow rate of the chlorosilane gas and carbon-containing gas is 0.1 to 30% of the total flow rate, wherein the resulting single crystal silicon carbide substrate contains a 4H silicon carbide epitaxial layer having a thickness of 1 nm up to 25 cm.

2. A method according to claim 1 wherein the gas mixture further comprises a doping gas.

3. A method according to claim 2 wherein the doping gas is nitrogen gas, phosphine gas, or trimethylaluminum gas.

4. A method according to claim 1 wherein the carbon-containing gas is $C_3H_8$ gas, $C_2H_6$ gas, $CH_3Cl$ gas, or $CH_3CH_2CH_2Cl$ gas.

5. A method according to claim 1, wherein the angle of tilt is 4 to 8 degrees and tilted to <1120>.

6. A method according to claim 1, wherein the angle of tilt is 8 degrees and tilted to <1120>.

7. A method according to claim 1, wherein the substrate is fabricated such that normal to its surface is tilted at an angle relative to the [0001] plane of the SiC of the crystal.

8. A method according to claim 5, wherein the substrate is fabricated such that normal to its surface is tilted at an angle relative to the [0001] plane of the SiC of the crystal.

9. A method according to claim 6, wherein the substrate is fabricated such that normal to its surface is tilted at an angle relative to the [0001] plane of the SiC of the crystal.

* * * * *